United States Patent [19]
Suzuki et al.

[11] Patent Number: 5,695,566
[45] Date of Patent: Dec. 9, 1997

[54] APPARATUS AND METHOD FOR PLASMA-PROCESSING

[75] Inventors: Masaki Suzuki, Hirakata; Shoji Fukui, Takatsuki; Yuji Tsutsui, Kadoma; Shigeyuki Yamamoto, Nara; Yasuo Tanaka, Kashihara, all of Japan

[73] Assignee: Matsushita Electric Industrial Co., Ltd., Osaka-Fu, Japan

[21] Appl. No.: 651,079

[22] Filed: May 22, 1996

[30] Foreign Application Priority Data

May 24, 1995 [JP] Japan .................. Hei 7-124815

[51] Int. Cl.[6] ........................................ C23C 16/00
[52] U.S. Cl. .................. 118/723 E; 118/728; 427/573
[58] Field of Search .................. 118/723 E, 723 ER, 118/728; 427/569, 573; 156/345, 643.1; 216/71; 204/298.15

[56] References Cited

U.S. PATENT DOCUMENTS

| 4,842,683 | 6/1989 | Cheng et al. | 156/345 |
| 4,931,135 | 6/1990 | Horiuchi et al. | 156/643 |
| 4,978,412 | 12/1990 | Aoki et al. | 156/345 |
| 5,013,400 | 5/1991 | Kurasaki et al. | 156/643 |
| 5,096,536 | 3/1992 | Cathey, Jr. | 156/643 |
| 5,494,522 | 2/1996 | Moriya et al. | 118/719 |
| 5,494,523 | 2/1996 | Steger et al. | 118/723 E |

FOREIGN PATENT DOCUMENTS

| 56-131930 | 10/1981 | Japan . |
| 56-131931 | 10/1981 | Japan . |
| 61-103530 | 5/1986 | Japan . |

*Primary Examiner*—John Niebling
*Assistant Examiner*—Joni Y. Chang
*Attorney, Agent, or Firm*—Panitch Schwarze Jacobs & Nadel, P.C.

[57] ABSTRACT

In a plasma processing apparatus having an upper electrode and a lower electrode in a vacuum chamber, a substrate receiving face of the lower electrode is formed to have a same convex surface as a deflected face of a substrate on condition that surface of the substrate is freely supported on an circumference thereof, and a uniform pressure is applied to the back of the substrate.

14 Claims, 5 Drawing Sheets

APPARATUS AND METHOD FOR PLASMA-PROCESSING

FIELD OF THE INVENTION AND RELATED ART STATEMENT

1. Field of the Invention

The present invention relates to an apparatus and method for plasma-processing, such as dry etching, sputtering, or chemical vapor deposition (CVD), which is used for making semiconductors and liquid crystal displays (LCD), and particularly relates to an apparatus and method for plasma processing, which uses gas as heat transfer means for cooling or heating a substrate.

2. Description of the Related Art

Recently, in a plasma processing apparatus for a semiconductor manufacturing, a conventional heat transfer means for cooling or heating a substrate on an electrode uses inert gases, such as helium (He) gas.

Hereafter, a dry etching apparatus of the conventional plasma processing is elucidated with reference to the accompanying drawing of FIG. 7. FIG. 7 is a schematic cross sectional side view of the conventional dry etching apparatus.

In FIG. 7 a vacuum chamber 41 of the dry etching apparatus is evacuated by an evacuating pump 42. An upper electrode 43, which is disposed in an upper region of the vacuum chamber 41, has plural gas outlet ports at lower face of the upper electrode 43. The upper electrode 43, which is connected to electrical ground through an earth cable 45, leads to a reactive-gas supply pipe 44 having a reactive-gas supply port 44a. The reactive-gas supply port 44a is arranged above the vacuum chamber 41.

A silicon wafer 46 to be processed is disposed on a lower electrode 47, which is mounted on an insulation board 48 in the vacuum chamber 41. The lower electrode 47 has a convex face or a flat face at upper surface thereof. The convex face is formed in a spherical surface. The convex face has about 150 mm in diameter, and about 0.5 mm in maximum projecting length from a plane including circumference of the convex face. The lower electrode 47 on the insulation board 48 is electrically connected to a high-frequency electric power supply 51 through a terminal 49 and a capacitor 50.

The lower electrode 47 has a center hole 52 at a center thereof. The center hole 52 is connected to a lower-pressure helium-gas supply means (not shown) through a heat-transferring-gas supply pipe 53. The lower electrode 47 also has a shallow dent 55, which is formed on the convex face, leads to the center hole 52. A seal ring 54 is arranged at a circumference of the convex face of the lower electrode 47. The lower electrode 47 is cooled by cooling water circulated in a passage 56, which is formed in the lower electrode 47.

A clamp frame 57, which is formed to have a ring shape, is arranged over the circumference of the lower electrode 47. The clamp frame 57 is movably supported by supporters 58, which are provided to pierce the wall of the vacuum chamber 41. The supporters 58 and the vacuum chamber 41 are connected by bellows 59 to seal the vacuum chamber 41. The supporters 58 is driven in up-and-down directions by a hoisting and lowering apparatus (not shown), which is provided at the outside of the vacuum chamber 41. And, the silicon wafer 46 is fixed to the lower electrode 47 by lowering the clamp frame 57.

Next, the operation of the conventional dry etching apparatus having the above-mentioned construction is explained.

The silicon wafer 46 to be processed is disposed on the lower electrode 47. The evacuating pump 42 evacuates air from the vacuum chamber 41. And the silicon wafer 46 is pressed to be formed along the convex face of the lower electrode 47 by lowering the clamp frame 57. In the next step, the evacuating pump 42 continues evacuating the vacuum chamber 41. The reactive-gas supply port 44a supplies minute quantity of etching gas to the vacuum chamber 41. At the same time, high frequency electric power is applied to the lower electrode 47 by the high-frequency electric power supply 51, so as to produce plasma between the upper electrode 43 and the lower electrode 47. Then, the silicon wafer 46 is etched by the plasma in the vacuum chamber 41.

In the etching process, the silicon wafer 46 is heated by the plasma having high temperature. In order to cool the heated silicon wafer 46, helium gas is flown from the heat-transferring-gas supply pipe 53 with about 1000 pascal of pressure. The helium gas spurts from the center hole 52 so that a space formed between the shallow dent 55 and the rear (lower) face of the silicon wafer 46 is filled with the helium gas. Since the helium gas has the high flowability, the heat of the silicon wafer 46 is absorbed by the helium gas with efficiency. And the heat of the helium gas is transferred to the lower electrode 47, which is cooled by the cooling water in the passage 56.

As mentioned above, the conventional dry etching apparatus prevents the silicon wafer 46 from over heating. The quality of a resist pattern on the silicon wafer is prevented from the plasma heating, thereby preventing an etching failure. The conventional dry etching apparatus of the plasma processing apparatus strives for keeping the temperature of silicon wafer 46 at a constant temperature by the heat transfer means so as to manufacture silicon wafer having good etching characteristics.

In the etching process, however, the conventional plasma processing apparatus using an electrode, which has the above-mentioned convex face having the spherical surface or a flat face used in the general plasma processing apparatus, has the following problems. The substrate to be processed is lifted from the surface of the convex face or the flat face at the center portion of the electrode by minute pressure of the helium gas as compared with the other portion. As a result, the lifting interval from the lower electrode at the center of the substrate is different from the lifting interval at the circumference of the substrate. Accordingly, the conventional plasma processing apparatus has such problem that the substrate to be processed is not uniformly cooled on any portion thereof, and electric field applied to the whole portion of the substrate is not uniform. Therefore, the conventional plasma processing apparatus can not carry out a uniform etching of the substrate.

When a large glass substrate of a liquid crystal display (LCD) is manufactured by using the conventional plasma processing apparatus, there was the following problem.

When the large glass substrate, for example, of the size of 370 mm (wide)×470 mm (long)×1.1 mm (thick), disposed on a flat electrode is processed by plasma, the large glass substrate is bent when lifted by the pressure of helium gas, and the large glass substrate is easily broken by stress owing to the bending of the large glass substrate. Therefore, it was difficult to keep the glass substrate cool by helium gas.

In the conventional plasma processing apparatus, the lower electrode was formed to have a simple convex face which has a spherical surface or a very simple projected shape because it is easy to form such surface on the lower electrode.

OBJECT AND SUMMARY OF THE INVENTION

It is an object of the present invention to provide an apparatus and method for plasma-processing, wherein the plasma process can be carried out uniformly and stably against a substrate to be processed, and can improve production yield of the substrate.

In one aspect, an apparatus for plasma-processing in accordance with the present invention comprises:

a vacuum chamber, air discharge means for evacuating said vacuum chamber, reactive gas supply means for supplying reactive gas into said vacuum chamber, at least a pair of electrodes, which are disposed apart from and facing to each other in said vacuum chamber, a principal face of one electrode is a substrate receiving face formed in a deflected face being defined such that under a condition that a surface of said substrate is freely supported at its four sides, a predetermined pressure is applied uniformly on the back of said substrate, clamp means for holding four sides of said substrate freely, power supply means for supplying high frequency electric power to at least one electrode, and heat transferring gas supply means for supplying heat transferring gas, into an aperture between said substrate receiving face and said substrate, at said predetermined pressure.

In another aspect, a method for plasma-processing of the present invention comprises the steps of:

evacuating a vacuum chamber by a discharge air means, supplying reactive gas into said vacuum chamber by reactive gas supply means, fixing a substrate to a substrate receiving face of one electrode of a pair of electrodes in said vacuum chamber by clamp means, and said substrate receiving face being formed in a deflected face being defined such that under a condition that the surface of said substrate is freely supported at its four sides, a predetermined pressure is applied uniformly on the back of said substrate, supplying heat transferring gas into an aperture between said substrate receiving face and said substrate, at said predetermined pressure, and supplying high frequency electric power to at least one electrode by power supply means.

According to the plasma processing apparatus of the present invention, since the electrode for disposing a substrate to be processed has the same surface as the deflected surface of the substrate receiving the pressure of the heat transferring gas, the substrate on the electrode is arranged to have the same aperture between the substrate and the electrode at any position. Then the temperature of the substrate on the plasma process becomes constant and uniform, and the electrical field on the subs%rate becomes uniform. Therefore, the plasma processing apparatus of the present invention can carry out an uniform etching operation.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENT

<<First embodiment>>

A first embodiment of a plasma processing apparatus in accordance with the present invention is described below with reference to the accompanying drawings of FIGS. 1 to 3. The plasma processing apparatus of the first embodiment is a dry etching apparatus for a glass substrate having a thin film transistor (TFT) on the surface of a liquid crystal display (LCD).

Figure 1:
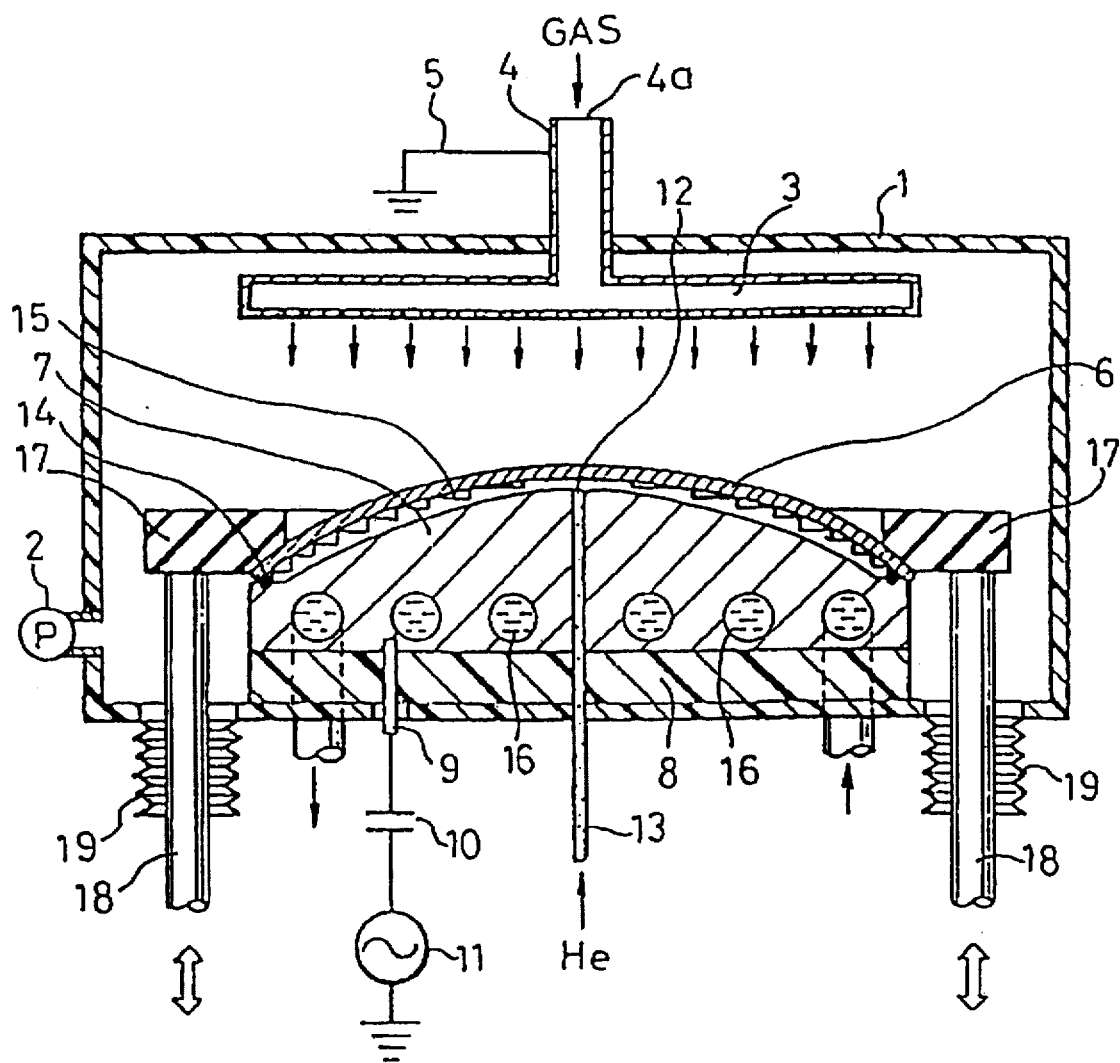
FIG. 1 is a schematic cross-sectional view of a first embodiment of a plasma processing apparatus in accordance with the present invention.

FIG. 1 shows a schematic cross-sectional view of the dry etching apparatus of the first embodiment. FIG. 2 shows a plan view of a lower electrode for a glass substrate of LCD in the dry etching apparatus of the first embodiment. FIG. 3 shows a schematic cross-sectional view taken on line III—III of FIG. 2. The lower electrode shown in FIGS. 1 and 3 has an exaggerated curvature for the purposes of illustration.

In FIG. 1, the dry etching apparatus comprises a vacuum chamber 1 evacuated by an evacuating pump 2. An upper electrode 3, which is disposed at an upper region of the vacuum chamber 1, has plural gas outlet ports at the lower face of the upper electrode 3. The upper electrode 3, which is connected to electrical ground through an earth cable 5, leads to a reactive gas supply pipe 4 having a reactive gas supply port 4a. The reactive gas supply port 4a is arranged above the vacuum chamber 1.

Figure 2:
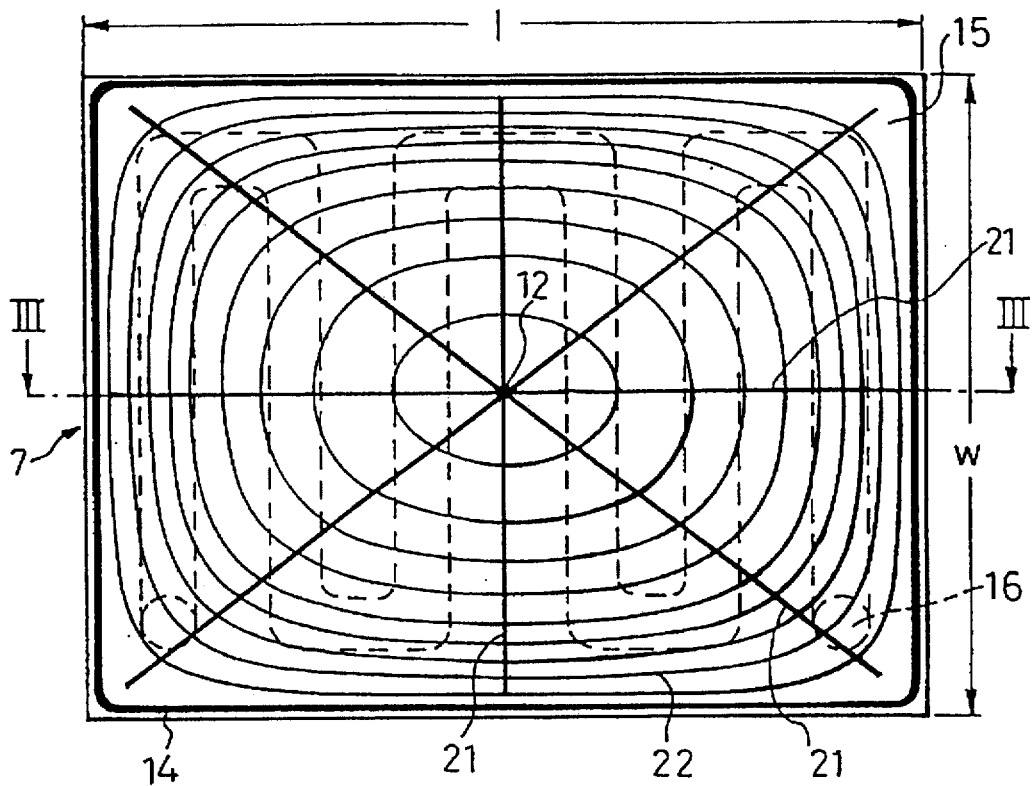
FIG. 2 is a top plan view of a lower electrode of the plasma processing apparatus of the first embodiment.

A glass substrate 6 having a width w and a length l as shown in FIG. 2 (370 mm (wide)×470 mm (long)×1.1 mm (thick)) to be processed for making a liquid crystal display (LCD) is disposed on a lower electrode 7 in the vacuum chamber 1. The lower electrode 7 is mounted on an insulation board 8 fixed to the vacuum chamber 1. The lower electrode 7 is electrically connected to a high-frequency electric power supply 11 through a terminal 9 and a capacitor 10.

The lower electrode 7 has a center hole 12 at the center of an upper face thereof. The center hole 12 is connected to a lower-pressure helium-gas supply means (not shown) through a helium-gas supply pipe 13. A seal ring 14 is arranged at a circumference of the upper face of the lower electrode 7 so as to seal against leakage of the helium-gas as a heat transferring means. The upper face of the lower electrode 7 is used as a substrate receiving face 15 for disposing the glass substrate 6 to be processed.

As shown in FIG. 1, a clamp frame 17, which is formed to have a rectangular shape, is arranged over the circumference of the lower electrode 7. The clamp frame 17 is supported by supporters 18, which are provided to pierce the wall of the vacuum chamber 1. The supporters 18 and the vacuum chamber 1 are connected by bellows 19 so as to seal the vacuum chamber 1. The supporters 18 are driven in up-and-down directions by a hoisting and lowering apparatus (not shown), which is provided at the outside of the vacuum chamber 1. The glass substrate 6 to be processed is fixed to the lower electrode 7 by lowering the clamp frame 17.

As shown in FIG. 2, the substrate receiving face 15 has a deflected face. The deflected face of the glass substrate 6 is formed when a perfectly flat glass substrate 6 is bent or deflected on condition that the surface of the glass substrate 6 is freely supported at its four sides, and predetermined uniform pressure (about 533.2 pascal) is applied to the back of the glass substrate 6. Hereafter, the above-mentioned special face is called "deflected face".

The lower electrode 7 is cooled by cooling water circulated in a meandering passage 16, which is formed in the lower electrode 7.

FIG. 2 shows the lower electrode 7 having a rectangular shape in plan view. As shown in FIG. 2, the substrate receiving face 15 of the lower electrode 7 has radial grooves 21 for speedily filling the aperture between the lower electrode 7 and the back of the glass substrate 6 with helium gas. The radial grooves 21 have about 2 mm in width and about 1 mm in depth.

Figure 3:
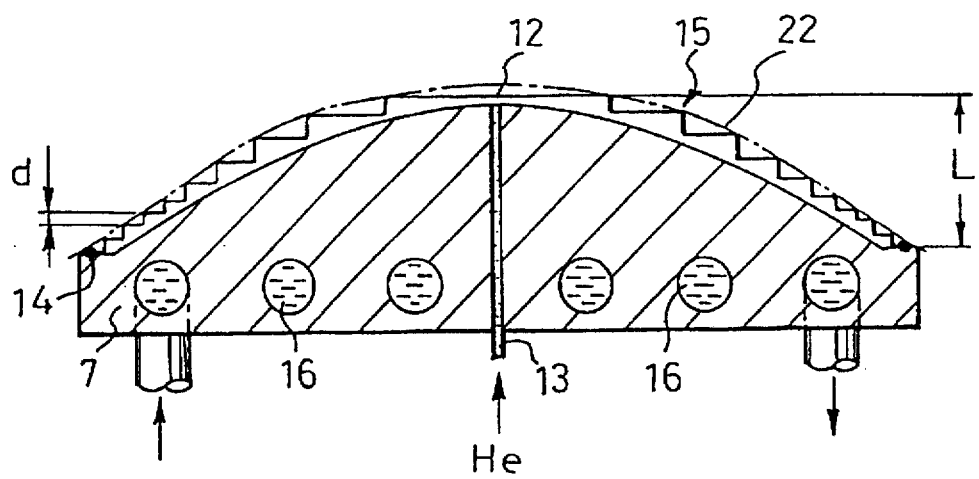
FIG. 3 is a schematic cross-sectional view of the lower electrode of the plasma processing apparatus of the first embodiment, taken along line III—III.

As shown in FIG. 3, the substrate receiving face 15 is formed to have a step-wise convex shape having concentrical contour lines. An enveloping surface 22 of the step-wise convex shape is an equivalent shape as the deflected face of the glass substrate 6 when the upper four sides of the glass substrate 6 are freely supported, and the uniform pressure of about 533.2 pascal (4 Torr) is applied to the back of the glass substrate 6. A vertical interval d (FIG. 3) of one step is about 50 μm, preferably from 10 μm to 200 μm. The vertical length L of the deflected face as the enveloping surface is determined by actually measuring the pressured glass substrate 6 (2.91 mm as shown in FIG. 3), or by computing precisely the transformation of the glass substrate 6. The deflected face of the lower electrode 7 is formed to have the above-mentioned stepwise convex shape by a NC (numerical control) milling cutter.

The clamp frame 17 has a rectangular frame which can press the four sides of the circumference of the rectangular glass substrate 6 for LCD.

Next, the operation of the above-mentioned plasma processing apparatus of the first embodiment is explained with reference of FIG. 1.

The glass substrate 6 to be processed is disposed on the lower electrode 7. Then the air in the vacuum chamber 1 is evacuated by the evacuating pump 2. The circumference portion of the glass substrate 6 is pressed against the deflected face of the lower electrode 7 by lowering the clamp frame 17, which is driven by the supporters 18. Therefore, the glass substrate 6 is formed to have a convex face 6.

In the next step, the vacuum chamber 1 is continued evacuating by the evacuating pump 2. And the reactive gas supply port 4a supplies a trace quantity (about 100 cc/min) of etching gas such as $CF_4$ gas, $CHF_3$ gas, $Cl_2$ gas, $BCl_3$ gas, HCl gas, HBr gas, or $O_2$ gas, or mixture thereof to the vacuum chamber 1. At the same time, high frequency electric power is applied to the lower electrode 7 by the high-frequency electric power supply 11, so as to produce plasma between the upper electrode 3 and the lower electrode 7. Then, the glass substrate 6 is etched by the plasma in the vacuum chamber 1.

In the above-mentioned etching process, the helium gas as the head transfer means is supplied from the heat-transferring-gas supply pipe 13 with about 533.2 pascal (4 Torr) of pressure. The helium gas comes out of the center hole 12 of the lower electrode 7 to an aperture between the glass substrate 6 and the lower electrode 7. The helium gas flows along the radial grooves 21 and the space on the stepwise surface of the lower electrode 7, thereby filling the aperture with the helium gas every corner. The glass substrate 6 is supported by the lower electrode 7 through the helium gas layer, having 0.05 mm maximum thickness which is a substantially the same thickness at every portion. The atoms of helium are shuttled to and fro at a velocity of hundreds meters per second in the helium gas layer. The glass substrate 6 is heated by the plasma and the lower electrode 7 is cooled by the cooled water in the meandering passage 16. Therefore, the heat of the glass substrate 6 is transferred with efficiency to the lower electrode 7 through the helium gas as heat transferring means.

When the etching process is finished, the supporters 18 are driven in an upward direction so as to leave the clamp frame 17 from the glass substrate 6, and thereby the glass finished substrate 6 is taken out from the vacuum chamber 1.

Apart from the above-mentioned first embodiment wherein the lower electrode is formed to have accurate contour lines having the same vertical interval, a modified embodiment may be such that the lower electrode is formed to have an uneven face by a milling machine so as to have the same surface as the enveloping surface of the above-mentioned first embodiment.

In the above-mentioned first embodiment, though the dry etching apparatus is explained as an embodiment of the plasma processing apparatus of the present invention, the present invention can be applied to a sputtering apparatus, a chemical vapor deposition (CVD) apparatus for cooling or heating a substrate because the plasma processing apparatus of the present invention has good heat transfer property.

The plasma processing apparatus of the first embodiment has the lower electrode having uniform microscopic stepwise shape, and the aperture between the substrate and the electrode is uniform. The heat transferring gas is speedily and smoothly supplied to the aperture between the substrate and the electrode. Thereby etching and cooling are made uniformly on the substrate to be processed. The plasma processing apparatus of the first embodiment can carry out the etching operation to have a uniform etching depth on all positions of the glass substrate. According to the inventors' experiments, the uniformity of the etching depth on the glass substrates was dramatically improved, from ±15% to ±7%, by the plasma processing apparatus of the first embodiment as compared with the conventional non-helium-cooled apparatus, and this He-cooled apparatus prevents the resist on the substrate deteriorated, 4 kW of high-frequency power, twice of the conventional apparatus is addible. This brings the etching rate twice as big as of the conventional apparatus. It is easy to design and form the lower electrode because the lower electrode has a simple step-wise shape. As a result, the cost of manufacturing for lower electrode is small.

<<Second Embodiment>>

Figure 4:
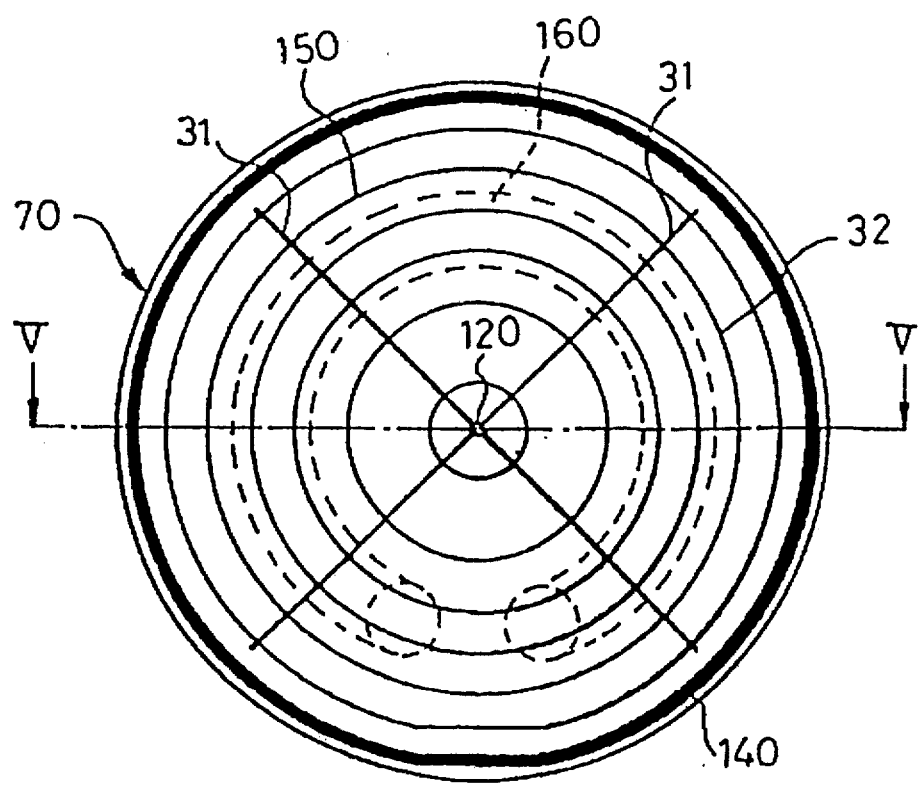
FIG. 4 is a top plan view of a lower electrode of a plasma processing apparatus of a second embodiment in accordance with the present invention.
Figure 5:
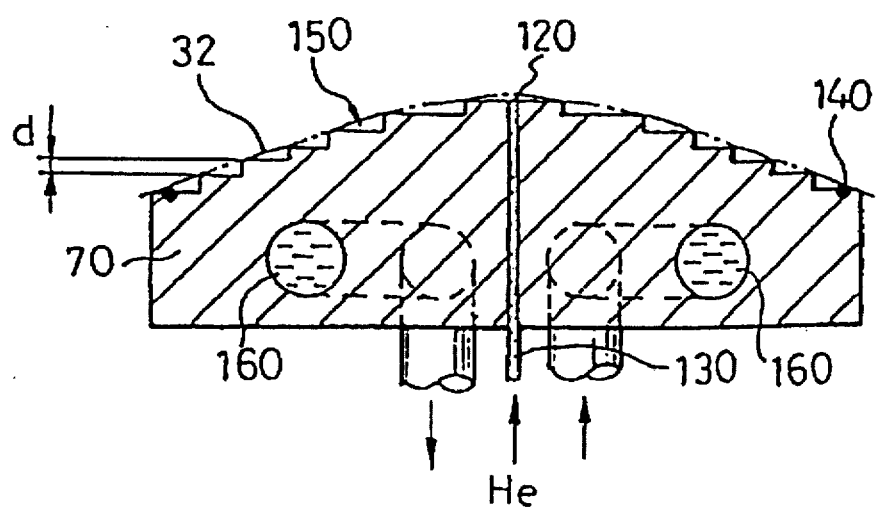
FIG. 5 is a schematic cross-sectional view of the lower electrode of the plasma processing apparatus of the second embodiment, taken along line V—V.

A second embodiment of a plasma processing apparatus in accordance with the present invention is described below with reference to the accompany drawings of FIGS. 4 and 5. FIG. 4 shows a plan view of a lower electrode in the plasma processing apparatus of the second embodiment. FIG. 5 shows a schematic cross-sectional view of the lower electrode of FIG. 4. The lower electrode shown in FIG. 5 has an exaggerated curvature for the purposes of illustration. Corresponding parts and components to the first embodiment are shown by the same numerals and marks, and the description thereon made in the first embodiment similarly applies. Differences and features of this second embodiment from the first embodiment are as follows.

The plasma processing apparatus of the second embodiment is a dry etching apparatus for a silicon wafer. The dry etching apparatus has an upper electrode and a lower electrode which are arranged in a vacuum chamber as shown in FIG. 1 of the aforementioned first embodiment.

As shown in FIGS. 4 and 5, the lower electrode 70 has a center hole 120 at the center of an upper face thereof. The center hole 120 is connected to a lower-pressure helium-gas supply means (not shown) through e helium-gas supply pipe 130.

A seal ring 140 is arranged at a circumference of the upper face of the lower electrode 70 so as to seal against leakage of the helium gas as a heat transferring means. The upper face of the lower electrode 70 is used as a substrate receiving face 150 for a silicon wafer. The substrate receiving face 150 has a convex surface. The convex surface the silicon wafer is bent or deflected on condition that the surface of the silicon wafer is freely supported at its circumference, and about 933.1 pascal (7 Torr) of predetermined uniform pressure is applied to the back of the silicon wafer. Hereafter, The above-mentioned special face is called "deflected face".

The lower electrode 70 is cooled by cooling water circulated in a passage 160, which is formed to have a substantially circular shape in the lower electrode 70.

As shown in FIG. 4, the substrate receiving face 150 of the lower electrode 70 has radial grooves 31 which are radially spread from the center hole 120 in four directions. The radial grooves 31 have about 2.0 mm in width and about 0.5 mm in depth. Therefore, an aperture between the lower electrode 70 and the silicon wafer is filled speedily and smoothly with the helium gas as heat transferring means.

As shown in FIG. 5, the substrate receiving face 150 is formed to have a step-wise convex shape having concentrical contour lines. A vertical interval d between the steps in the step-wise convex shape is about 50 µm, preferably from 10 µm to 200 µm. An enveloping surface 32 of the step-wise convex shape is an equivalent shape to the aforementioned deflected face of the silicon wafer. This enveloping surface 32 can be determined by measuring the formation of the silicon wafer on condition that the back of the silicon wafer is pressed by about 933.1 pascal (7 Torr) of uniform pressure in practice, or by computing analysis of the formation of the silicon wafer. The step-wise convex shape of the lower electrode 70 of the second embodiment is formed by a lathe or a milling cutter.

A clamp frame, which is provided for fixing the silicon wafer to the lower electrode 70, has a ring shape so as to press the circumference of the silicon wafer on the lower electrode 70.

In the second embodiment, the silicon wafers of 3 inch, 4 inch, 5 inch, 6 inch, 8 inch and 12 inch are used for dry etching. The substrate receiving faces 150 for these silicon wafers have different shapes in every silicon wafer. The formation of the substrate receiving face of each silicon wafer is obtained by the following approximate formulas in Table 1.

TABLE 1

Approximate formulas representing deflected face of lower electrode
Wafer r: radius of the deflected face (mm)
size h: projecting length of the deflected face
(inch) (µm)

| | |
|---|---|
| 3 | $h = 0.027252 \times r - 0.160423 \times r^2 + 0.002905 \times r^3 - 2.4691 \times 10^{-4} \times r^4 + 9.5623 \times 10^{-6} \times r^5 - 1.1139 \times 10^{-7} \times r^6$ |
| 4 | $h = -0.004574 \times r - 0.099901 \times r^2 + 8.3501 \times 10^{-5} \times r^3 + 8.8549 \times 10^{-6} \times r^4$ |
| 5 | $h = -0.005067 \times r - 0.092481 \times r^2 - 1.1354 \times 10^{-4} \times r^3 + 8.2711 \times 10^{-6} \times r^4 - 2.3463 \times 10^{-8} \times r^5$ |
| 6 | $h = 0.001686 \times r - 0.110146 \times r^2 + 8.4503 \times 10^{-5} \times r^3 + 4.2014 \times 10^{-6} \times r^4$ |
| 8 | $h = 0.002474 \times r - 0.104180 \times r^2 + 6.0704 \times 10^{-5} \times r^3 - 9.3620 \times 10^{-7} \times r^4 + 1.7946 \times 10^{-8} \times r^5$ |
| 12 | $h = 0.57937 \times r - 0.10862 \times r^2 + 0.0009178 \times r^3 - 0.000009545 \times r^4 + 0.00000003215 \times r^5$ |

TABLE 2

| Wafer size (inch) | Diameter (2r) of wafer (mm) | Thickness (mm) | Projecting length (H) at center of wafer (mm) |
|---|---|---|---|
| 3 | 76 | 0.381 | 0.155 |
| 4 | 100 | 0.525 | 0.185 |
| 5 | 125 | 0.625 | 0.276 |
| 6 | 150 | 0.675 | 0.469 |
| 8 | 200 | 0.75 | 0.874 |
| 12 | 300 | 0.775 | 1.575 |

Table 2 shows concrete projecting length (mm) at the center of the deflected faces for each silicon wafer.

Figure 6:
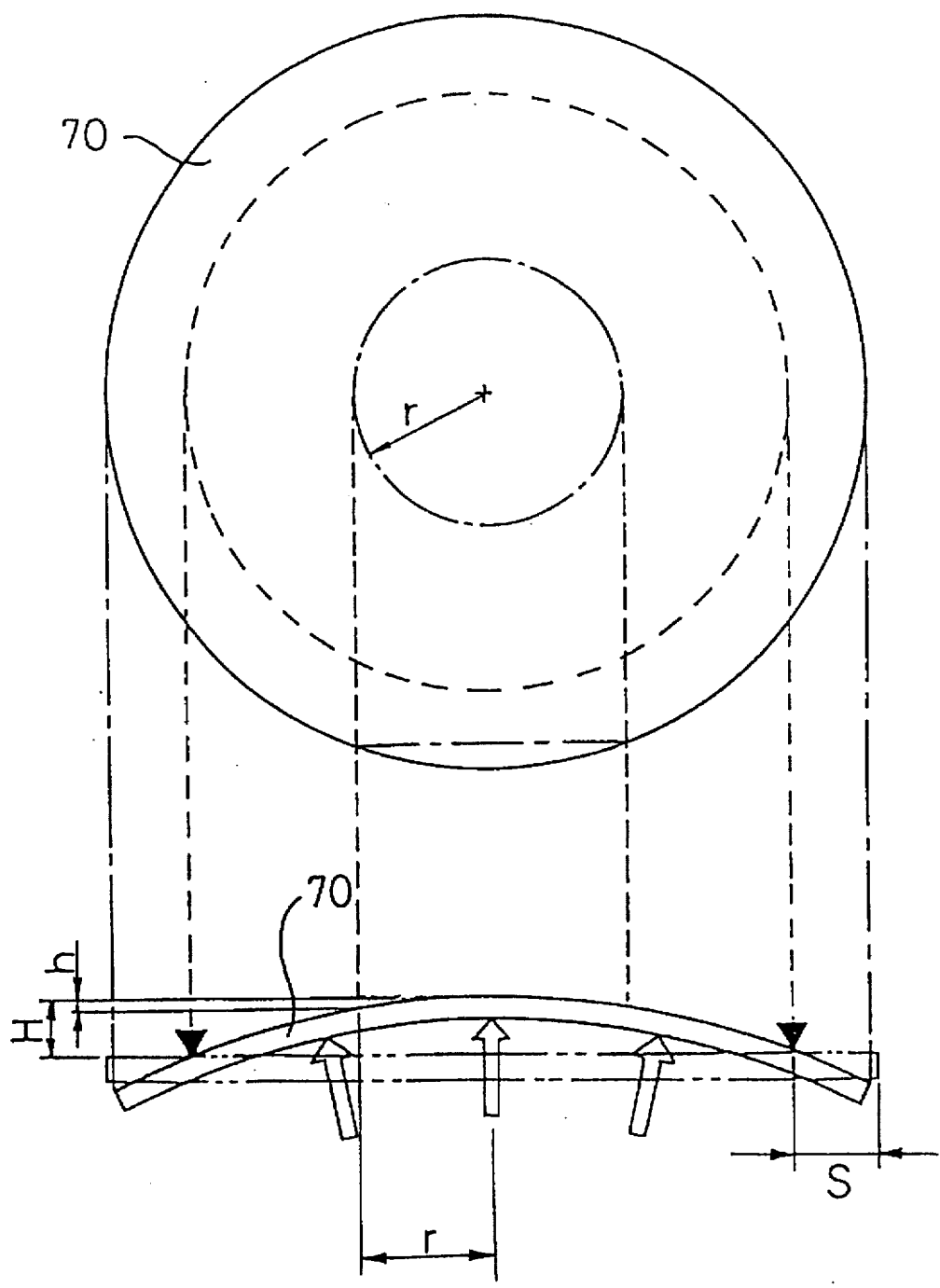
FIG. 6 is a schematic illustration of a silicon wafer for analyzing a deflected surface thereof.

In the analysis for finding the deflected face of the silicon wafer shown in Tables 1 and 2, the silicon wafer to be analyzed was supported at an inner circle of a radial distances of 1.5 mm from edge of the silicon wafer as shown in FIG. 6. FIG. 6 shows a schematic illustration of a silicon wafer in the condition for analyzing the deflected face. In the condition shown in FIG. 6, when the back of the silicon wafer is pressed by the uniform pressure (7 Torr) so that the silicon wafer was deformed to have the deflected face having the projecting length h shown in Tables 1 and 2. In FIG. 6, a letter r shows the radius of the deflected face, and a letter r shows the projecting length of the deflected face at the center position. In the analysis for finding the deflected faces of the silicon wafers, for the silicon wafer of 3 inches to 8 inches, 10890 kgf/mm² of Young's modulus, and 0.42 of Poisson ratio is applied, and for the silicon wafer of 12 inches, 19400 kgf/mm² of Young's modulus, and 0.25 of Poisson ratio is applied.

Figure 7:
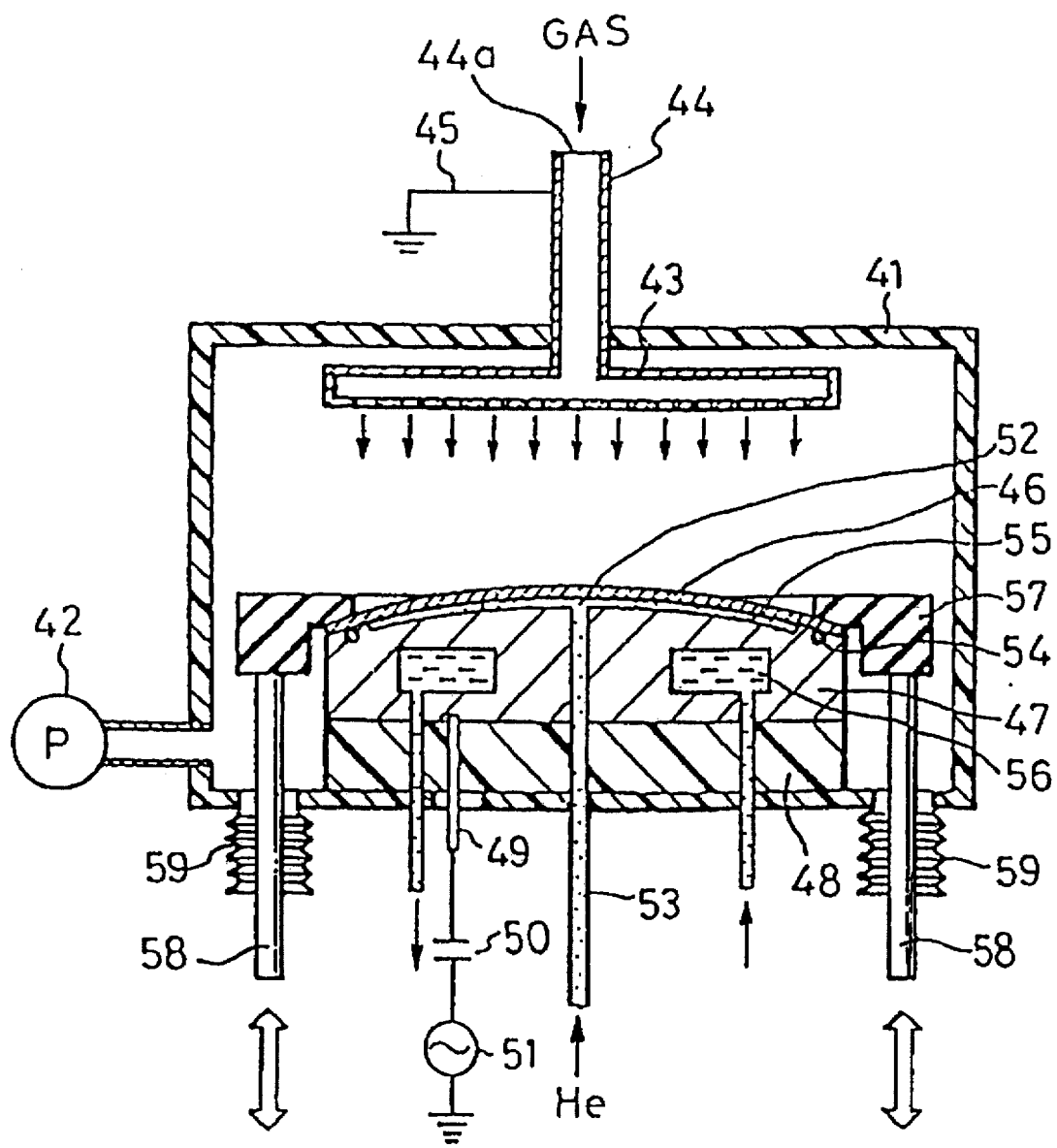
FIG. 7 is the schematic cross-sectional view of the conventional plasma processing apparatus.

As shown in Tables 1 and 2, the substrate receiving faces 150 have different shades for each silicon wafer of 3 inches, 4 inches, 5 inches, 6 inches, 8 inches and 12 inches. Since the lower electrodes 70 for the silicon wafers are formed in the above-mentioned different surfaces corresponding to each size of the silicon wafer, an interval between the substrate receiving face 150 and the back of the silicon wafer is kept at a constant substantially on all positions of the silicon wafer. Accordingly, the silicon wafer on the substrate receiving face 150 is cooled equally on all positions, and has substantially the same electric field at all positions of the silicon wafer, thereby obtaining a uniform etching for the silicon wafers. According to the inventors' experiments, the uniformity of the etching depth on the 6 inch silicon wafers was dramatically improved, from ±7% to ±4%, by the apparatus of the second embodiment as compared with the conventional apparatus like the apparatus shown in FIG. 7.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A plasma processing apparatus, comprising:
   a vacuum chamber;
   air discharge means for evacuating said vacuum chamber;
   reactive gas supply means for supplying reactive gas into said vacuum chamber;
   a first electrode and a second electrode disposed in said vacuum chamber, said first and second electrodes being spaced apart from and facing each other, wherein an upper surface of said first electrode forms a substrate receiving face defined for receiving a substrate and having a step-wise convex shape such that when a substrate is freely supported along its circumference on said substrate receiving face and a heat transferring gas supply means supplies gas at a uniform pressure to a back surface of said substrate, an enveloping surface of said step-wise convex shape has substantially the same shape as said back surface of said substrate;
   clamp means for holding a circumference of a substrate on said substrate receiving face;
   power supply means for supplying electric power to at least the first electrode; and
   heat transferring gas supply means for supplying heat transferring gas at a uniform pressure to an aperture formed between a substrate and said substrate receiving face when a substrate is freely supported along its circumference on said substrate receiving face.

2. The plasma processing apparatus according to claim 1, wherein
   said substrate receiving face of said first electrode has a substantially circular shape in plan view and said clamp means has a substantially circular shaped portion for pressing on a circumference of a substantially circular shaped substrate on said substrate receiving face.

3. The plasma processing apparatus according to claim 1, wherein
   said substrate receiving face of said first electrode has grooves which spread radially from a centrally located hole extending through said substrate receiving face.

4. The plasma processing apparatus according to claim 1, wherein
   said first electrode comprises cooling means within said first electrode for cooling said first electrode.

5. The plasma processing apparatus according to claim 1, wherein
   said substrate receiving face has an enveloping surface which is defined to have substantially the same shape as a deflected silicon wafer, and wherein, for a radius r as measured from a central axis of said first electrode along a plane extending perpendicularly from said central axis to a point intersecting said enveloping surface, said substrate receiving face has a projecting length h as measured along said central axis between said plane and an upper plane extending perpendicularly from said central axis when the radius r is zero.

6. The plasma processing apparatus according to claim 5, wherein the projecting length h of said substrate receiving face for use with an 8 inch silicon wafer substrate is defined by $$h = (0.002474 \times r) - (0.104180 \times r^2) + (6.0704 \times 10^{-5} \times r^3) - (9.3620 \times 10^{-7} \times r^4) + (1.7946 \times 10^{-8} \times r^5).$$

7. The plasma processing apparatus according to claim 5, wherein the projecting length h of said substrate receiving face for use with a 12 inch silicon wafer substrate is defined by $$h = (0.57937 \times r) - (0.10862 \times r^2) + (0.0009178 \times r^3) - 0.000009545 \times r^4) + (0.00000003215 \times r^5).$$

8. A plasma processing apparatus according to claim 11, wherein
   said substrate receiving face has an enveloping surface which is defined to have substantially the same shape as a deflected glass substrate for a liquid crystal display.

9. A method for plasma-processing, comprising the steps of:
   evacuating a vacuum chamber using an air discharge means, said chamber comprising a first electrode having a substrate receiving face and a second electrode;
   supplying reactive gas into said vacuum chamber by reactive gas supply means;
   freely supporting a substrate on said substrate receiving face by clamp means, said substrate receiving face being defined for receiving said substrate, and said substrate receiving face having a step-wise shape such that when said substrate is freely supported along its circumference on said substrate receiving face and a heat transferring gas is supplied at a uniform pressure to an aperture formed between said substrate and said substrate receiving face, an enveloping surface of said step-wise convex shape has substantially the same shape as a back surface of said substrate arranged to face said substrate receiving face;
   supplying heat transferring gas at a uniform pressure to said aperture; and
   supplying high frequency electric power to at least said first electrode by power supply means.

10. The method according to claim 9, wherein
   said substrate receiving face of said first electrode has a substantially rectangular shape in plan view and said clamp means has a substantially rectangular shaped portion for pressing on said circumference of said substrate on said substrate receiving face, said substrate being substantially rectangularly shaped.

11. The method according to claim 9, wherein
   said substrate receiving face of said first electrode has a substantially circular shape in plan view and said clamp means has a substantially circular shaped portion for pressing on said circumference of said substrate receiving face, said substrate being substantially circular shaped.

12. The method according to claim 9, wherein
   said substrate receiving face of said first electrode has grooves which spread radially from a centrally located hole extending through said substrate receiving face.

13. The method for plasma-processing according to claim 9, wherein
   said first electrode comprises cooling means within said first electrode for cooling said first electrode.

14. A plasma processing apparatus, comprising:

a vacuum chamber;

air discharge means for evacuating said vacuum chamber;

reactive gas supply means for supplying reactive gas into said vacuum chamber;

a first electrode and a second electrode disposed in said vacuum chamber, said first and second electrodes being spaced apart from and facing each other, wherein an upper surface of said first electrode forms a substrate receiving face defined for receiving a substrate and having a step-wise convex shape such that when a substrate is freely supported along its circumference on said substrate receiving face and a heat transferring gas supply means supplies gas at a uniform pressure to a back surface of said substrate, an enveloping surface of said step-wise convex shape has substantially the same shape as said back surface of said substrate;

clamp means for holding a circumference of a substrate on said substrate receiving face;

power supply means for supplying electric power to at least the first electrode; and heat transferring gas supply means for supplying heat transferring gas at a uniform pressure to an aperture formed between a substrate and said substrate receiving face when a substrate is freely supported along its circumference on said substrate receiving face, wherein said substrate receiving face of said first electrode has a substantially rectangular shape in plan view and said clamp means has a substantially rectangular shaped portion for pressing on a circumference of a substantially rectangularly shaped substrate on said substrate receiving face.

* * * * *